United States Patent [19]

Losert et al.

[11] 4,230,793

[45] Oct. 28, 1980

[54] PROCESS FOR THE PRODUCTION OF SOLDER MASKS FOR PRINTED CIRCUITS

[75] Inventors: Ewald Losert, Rheinfelden; Heinz Rembold, Arlesheim, both of Switzerland

[73] Assignee: Ciba-Geigy Corporation, Ardsley, N.Y.

[21] Appl. No.: 960,971

[22] Filed: Nov. 15, 1978

[30] Foreign Application Priority Data

Nov. 21, 1977 [CH] Switzerland ............... 14182/77

[51] Int. Cl.² ............................................. G03C 5/00
[52] U.S. Cl. .................................... 430/315; 430/935; 427/96; 427/420
[58] Field of Search ............ 427/96, 43; 430/315, 430/935

[56] References Cited

U.S. PATENT DOCUMENTS

| | | | |
|---|---|---|---|
| T857,041 | 12/1968 | Eells | 427/420 |
| 2,963,002 | 12/1960 | Glaus | 118/324 |
| 3,132,968 | 5/1964 | Wandtke | 118/324 |
| 3,205,089 | 9/1965 | Kinzelman | 427/420 |
| 3,500,610 | 3/1970 | Chenoweth | 118/324 |
| 3,876,465 | 4/1975 | Prazak | 427/420 |
| 4,018,940 | 4/1977 | Morgan | 427/96 |
| 4,064,287 | 12/1977 | Lipson | 427/96 |
| 4,150,169 | 4/1979 | Bagley | 427/420 |
| 4,153,855 | 5/1979 | Feingold | 427/43 |

*Primary Examiner*—Sam Silverberg
*Attorney, Agent, or Firm*—Harry Falber

[57] ABSTRACT

A process for producing solder masks on double sided printed circuit boards, comprising conveying the boards beneath a free falling curtain of a pohotopolymer to form a thin layer on a surface of the board, irradiating with ultra violet light areas of the surface other than those that need to be soldered and then, by subsequent development, dissolving the unirradiated areas of the layer. The viscosity of the photopolymer is between 500 to 1200 mPa's at impingement on the surface of the circuit and the height of the curtain is selected so that the rate of flow of the polymer onto the circuit is between 60 to 160 m/min. Also the rate at which the circuits are conveyed beneath the curtain is greater than a rate slightly less than the rate at which the polymer flows onto the circuit.

3 Claims, 9 Drawing Figures

PROCESS FOR THE PRODUCTION OF SOLDER MASKS FOR PRINTED CIRCUITS

FIELD OF THE INVENTION

The invention relates to a process for producing solder masks on printed circuits.

There is an increasing trend among the makers of double sided printed circuit boards to apply a solder mask to printed circuits before soldering. The function of the solder masks is to provide protection during soldering for all those zones of the circuit surface which must not make contact with the solder metal so that unwanted conductive bridges between conductors are avoided. However, such masks are also required to act as isolating layers to protect the circuits from foreign matter and the effects of humidity.

PRIOR ART

A very wide variety of products and processes have been devised to ensure satisfactory compliance with the above two requirements. The solder mask must have a predetermined image structure since it must not cover any of the apertures in the double sided printed circuit boards in which leads from components are to be soldered and any lugs or tags provided at places where the circuit has to make contact with other elements. It was therefore a relatively obvious step to use printing processes to apply a mask image of lacquer or varnish which must have a predetermined thickness if it is to perform the functions outlined satisfactorily and if the conductors are to be embedded in it satisfactorily. In consequence screen printing has been used to produce such masking and has proved a satisfactory practical method of producing solder masks. Screen printing can rapidly produce a solder mask which can be reproduced to an extent satisfactory for mass production. The lacquers or varnishes used for the higher-quality systems are two-phase systems based on epoxy resins and, recently, solvent-free acrylate-based resins have been used which are cured by ultra-violet radiation. The disadvantage of this procedure is that the screen printing technique, produces an image of only one particular resolution. Another disadvantage in the case of short runs or prototypes is the cost of producing the printing screens.

Since the establishment of the small conductor technique in which a very large number of very small conductors are printed on a circuit board with very small spacing between the conductors, screen printing has often proved unable to provide the required resolution for the mask image. Another disadvantage in this context is that the printing inks used continue to flow after printing—i.e., while the inks are drying. Consequently, the areas on the masks for masking the apertures must be made larger on the printing screen than is really desirable. Also, when printing large areas—i.e., large circuit formats—the distortion of the printing screen causes a shift or displacement of the printing relative to the circuit.

Consequently, endeavours have been made to produce improved processes for producing a mask image of relatively high resolution for the small-conductor art. It was therefore a relatively obvious step to use photo-processes in association with UV (ultra-violet) sensitive photopolymers.

For instance, in one known process of this kind a photopolymer film in the form of a thin foil is first pressed on to the surface of the circuit by means of a heated roller. The photopolymer film is then covered by a negative and irradiated by UV-light, whereafter the negative is removed and the unexposed or unirradiated areas are dissolved out by means of appropriate developers. A mask image is therefore provided which has a much finer image structure than screen-printed masks. The disadvantages of this film process are that an elaborate technology is required to ensure that the solder-inhibiting films are so applied to the surface of the printed circuit as to adhere satisfactorily and without inclusions of air. If the most minute traces of humidity, air or foreign matter remain between the film and the circuit, bubbles and lifting of the mask from the circuit surface may occur during subsequent soldering with very detrimental consequences.

If liquid lacquers or varnishes are used, provided that the flow is satisfactory, it ought to be possible to produce a satisfactory void-free surface so that there are no inclusions of air. Unfortunately, it has, so far as is known to the applicant, proved impossible to use lacquers of this kind in producing solder masks, even though the lacquers have all the required properties such as high image resolution, good ability to stick to metal and synthetic resins, good thermal, mechanical and electrical properties after storage in damp conditions and a good ability to resist chemicals. The main difficulty resides in being able to apply the required layer of lacquer uniformly and without bubbles in a limited number of working steps while ensuring that the apertures in a double-sided printed circuit board do not become clogged. If lacquers of this kind are applied to a double-sided printed circuit board, by roller coating or dipping or by screen printing using empty screens, a plug or clot of lacquer is usually produced in the apertures and cannot subsequently be removed satisfactorily by the developing process. As a rule, the times required to free the apertures during development are longer than the times required to produce a satisfactory image when ordinary lacquers are used. The result is the further disadvantage that the irradiation or exposure time required for the UV-cured lacquer to become stable must be increased, again with the result of unsatisfactory resolution. Spraying processes which have to take into account various parameters, such as the distance between the spraying nozzle and the circuit, the spraying angle, the spraying pressure etc., can be used to coat circuits so that the sprayed material covering the apertures can be removed during development, but it is very difficult to ensure uniform layer thicknesses in this kind of process. Also, since solvent vapours are produced by spraying, expenditure must be increased on protective facilities to comply with factory hygiene rules and regulations.

OBJECT OF THE INVENTION

The object of the invention is to provide a process for producing solder masks on printed circuits having one or more apertures in consecutive steps, by applying a liquid photopolymer curable by irradiation, such as ultra-violet light, in a thin layer to the printed circuit, irradiating the layer except in those areas to be soldered, and then developing the cured layer with an agent which dissolves the unirradiated areas.

It has surprisingly been found that the problem can be solved by means of a curtain coating process in which process parameters, such as the viscosity of the poured compound, curtain height and the speed at which the printed circuits pass continuously through the curtain are carefully interrelated.

SUMMARY OF THE INVENTION

According to the invention, therefore, a liquid substance is applied as a flowing curtain to printed circuits conveyed through the curtain, first the viscosity of the liquid substance being so adjusted as to be from 500 to 1200 mPa's, (millipascal/seconds), preferably from 600 to 900 mPa s, at impingement on the printed circuits, second, the height of the curtain being such that the rate of flow of curtain at impingement on the printed circuits is approximately from 60 to 160 m/min., preferably from 70 to 120 m/min., and third the rate of conveyance of the printed circuits being only slightly less than but preferably greater than, the final speed of the curtain.

BRIEF DESCRIPTION OF THE DRAWINGS

Preferred embodiments of the invention will now be described in greater detail with reference to the accompanying drawings wherein.

DETAILED DESCRIPTION OF PREFERRED EMBODIMENTS

Figure 1:
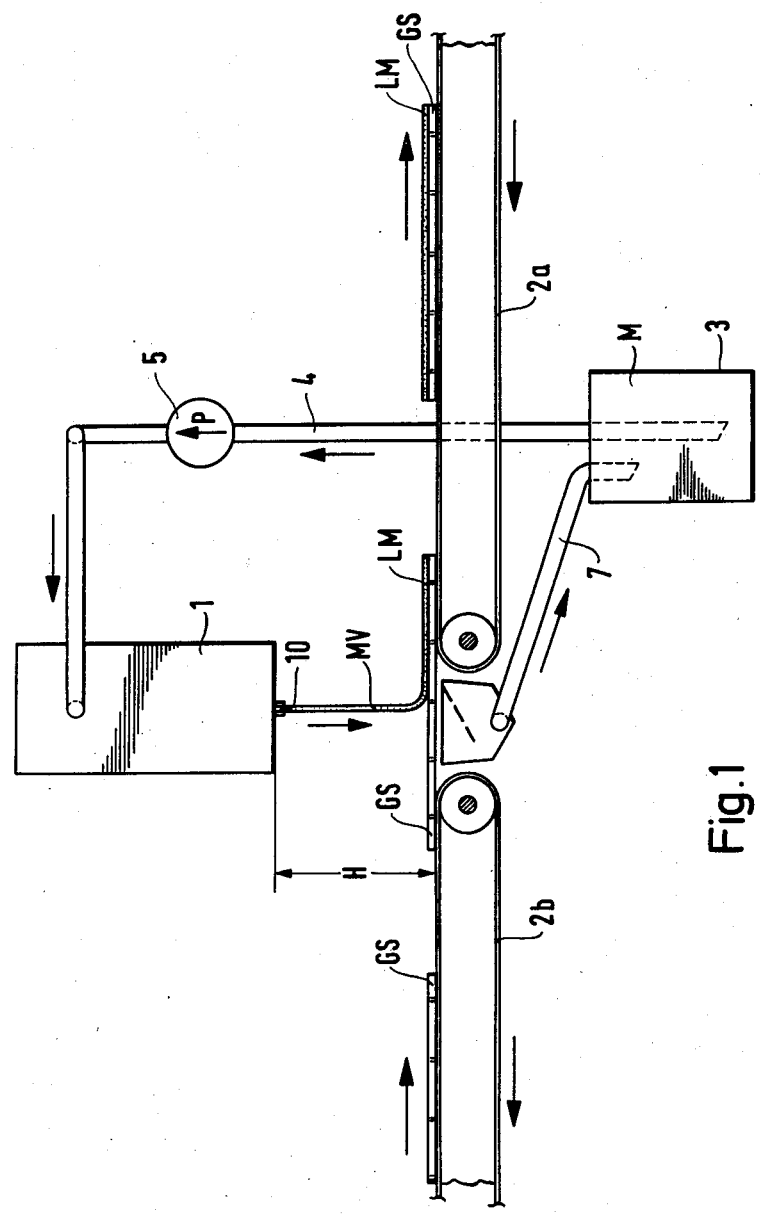
FIG. 1 is a diagrammatic view of a coating apparatus for performing the process in accordance with this invention.

The coating machine shown in FIG. 1 comprises a coating or pouring header tank 1, in which there is a coating or pouring slot 10, a conveyor comprising two conveyor belts 2a, 2b; a supply tank 3; a feed line 4; a pump 5; trough 6 and a return line 7. Preferably, the distance H between header tank 1, and belts 2a and 2b is vertically adjustable by movement of tank 1. Similarly, the width of the slot 10, the rate at which the pump 5 delivers lacquer to the header tank 1, and the speed of the belts which are driven by a motor (not shown) are variable over wide ranges.

Printed circuits GS to be coated are moved by conveyor belts 2a, 2b below tank 1; a coating resin composition M issuing from slot 10 drops in the form of a substantially free-falling curtain MV onto the boards or the like GS and forms thereon a thin coating LM. Since the boards GS are very thin compared with the height of the curtain, the distance between the tank 1 and the boards GS is substantially the same as the distance H between the tank 1 and the conveyor belts 2a or 2b.

Figure 2A:
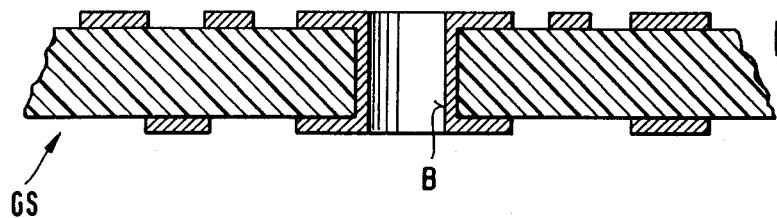
FIGS. 2a to 2d show the main phases of a first embodiment of the process.
Figure 2B:
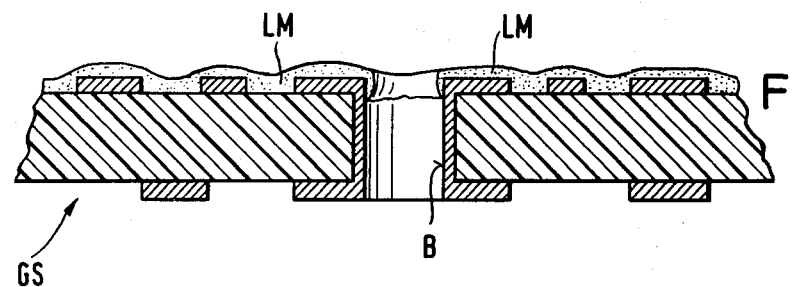
Figure 2C:
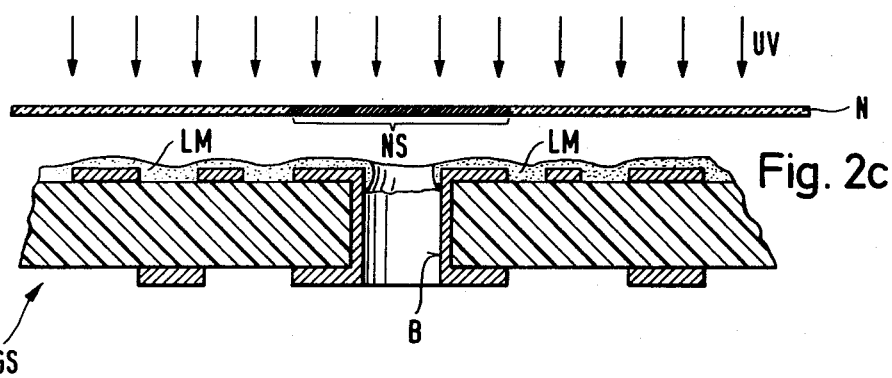

As can be gathered from the following example and from FIGS. 2a to 2c, the viscosity, curtain height and rate of conveyance can be related to one another so as to produce a coating IM forming an ideal solder mask. A lacquer-coating machine of the kind shown in FIG. 1 and produced by the company Burkle & Co., Maschieenfabrik, of Freudenstadt, Federal Republic of Germany, type LZKL 400, was used for the preparation of a solder mask, to be described hereinafter.

Details of the production of the solder mask are as follows:

The following approximately 39% polymer solution having a viscosity of approximately 750 mPa s at ambient temperature was introduced into the coating machine (tank 3) at an ambient temperature of approximately 25° C.:

1500 g of a photosensitive epoxy resin of molecular weight 2000 and having an epoxy content of 0.8–1.0 Aequ/kg.;
48 g of 2.6 diguanide xylene;
1000 g of 1-acetoxy-2-ethoxy ethane;
1300 g of ethylene glycolmonomethyl ether, and 3 g of dye.

The rate of descent of the curtain at its bottom end was approximately 70–90 m/min. with the tank 1 at a height H of 100 mm above the belts and with a 0.6 mm gap width of the slot 10. The conveyor belts 2a, 2b were set to run at 130 m/min.

The circuit board GS had a plurality of 2 mm conductors on both sides and was 210 mm×300 mm, 0.8 mm diameter apertures B being formed in the board. After coating the board had a lacquer coating of 6.10 g. After subsequent drying at 80° C. for 60 min in a ventilated drying cupboard, the thickness of the lacquer layer on the 2 mm conductors was 20–22μ. Only at their top edges were the apertures coated with a thin film of lacquer. The coated printed circuits were exposed under a 5000-watt metal halide UV lamp for 30 sec through a negative film, and then developed in a solution of cyclohexanone.

Inspection of the apertures and of the lacquer mask showed that the apertures were satisfactorily clean and that contours were very sharp.

After subsequent curing at 130° C. for 1 hour, the coated printed circuit was treated by means of a conventional solder flow at 260° C., whereafter the lacquer was in a satisfactory state and the apertures had been satisfactorily filled with solder.

Figure 2D:
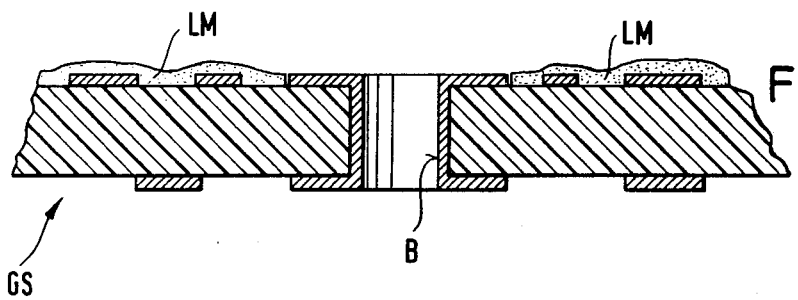

FIGS. 2a–2d are sections to an enlarged scale through a region of the board GS near an aperture during the main phases, FIG. 2a showing the board before coating, FIG. 2b showing the board after coating, FIG. 2c showing the board during exposure and FIG. 2d showing the board after development.

As FIG. 2b shows, the aperture B is devoid of coating except about its top edge region.

Referring to FIG. 2c, exposure (irradiation) and the resulting curing of the layer IM proceed with the interposition of a negative mask N by means of UV radiation symbolized by arrows UV. Those parts of the layer or coating IM which are below the UV-impervious (black) region NS of the negative mask are not cured.

During subsequent development (not shown) the uncured regions of the layer IM are removed. Those parts of the layer IM which remain after development form the solder mask. FIG. 2D shows the finish-masked board.

The coating can take the form of a mixture of resin and curing agent; as compared with the previous example, the mixture has a higher solids content and is processed at elevated temperature to achieve optimum coating or pouring viscosity. Another difference from the previous example is that the distance between the tank 1 and the conveyor belt is increased, as is the rate of advance of the board GS. Preferably, the temperature of the coating composition is adjusted so as to be at least 20° C. higher than the temperature of the board G upon impingement thereon. This feature greatly accelerates solidification on the board. These modifications make it possible to apply to the circuit in a single coating step a relatively thick lacquer film which when dry stretches like a skin over the apertures B. Since the amount of resin flowing into the apertures is small, the solder mask can be developed satisfactorily after exposure and all the unwanted resin residues can be removed from the apertures.

Figure 3A:
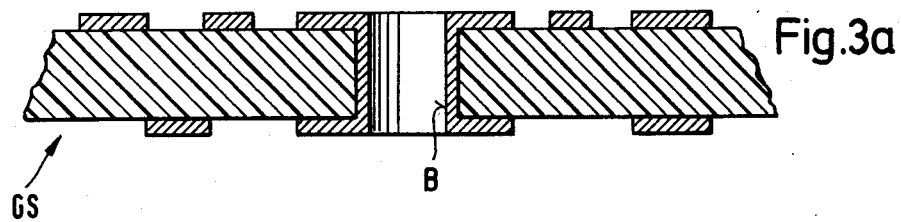
FIGS. 3a to 3d show the main phases of a second embodiment of the process.
Figure 3B:
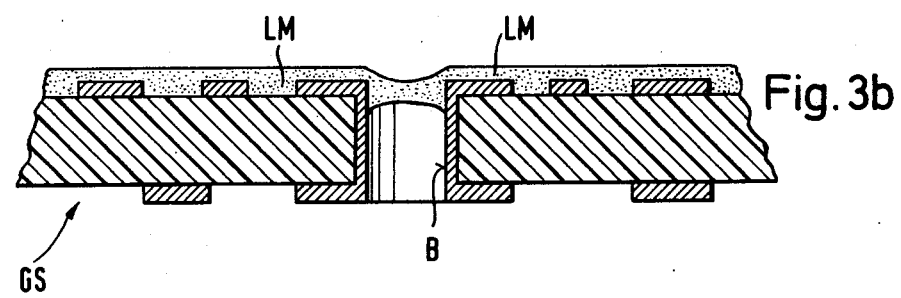
Figure 3C:
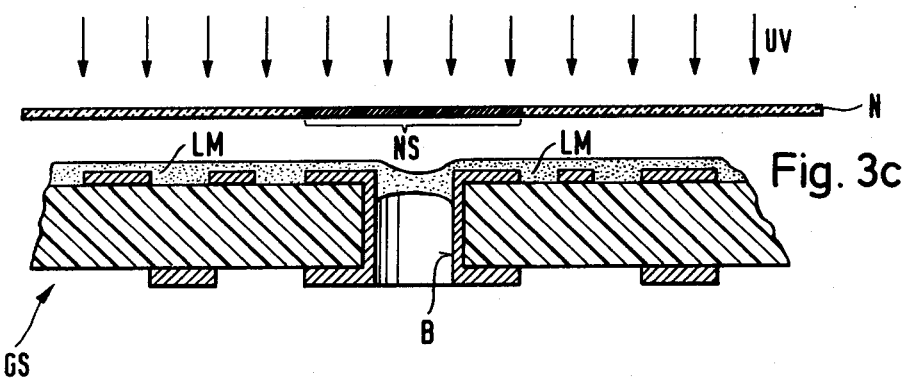
Figure 3D:
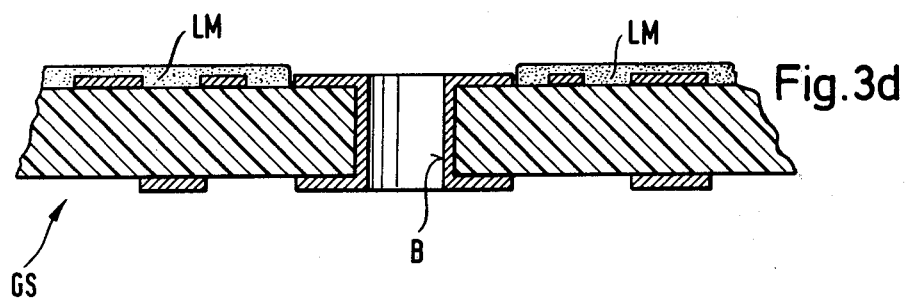

FIGS. 3a to 3d show the same zone of the board GS as FIGS. 2a to 2d during and after the main steps of the modified process, FIG. 3a showing the board before coating, FIG. 3b showing the board after coating, FIG. 3c showing the board during exposure and FIG. 3d showing the board after development. In contrast to FIGS. 2b–2d, FIG. 3b–3d show a thicker layer IM, while in FIGS. 3b and 3d the apertures B are not "open" but covered by a thin skin. This is dissolved and removed in development (between steps 3c and 3d). The apertures of the solder mask shown in FIG. 3d are completely free of solder-inhibiting lacquer.

We claim:

1. A process for producing solder masks on printed circuits having at least one aperture therethrough by applying a thin layer of a liquid substance curable by irradiation to a printed circuit, irradiating the layer except in the those areas of the circuit to be soldered, and developing the layer with an agent which disolves the unirradiated zones: wherein the improvement comprises, applying said layer to said circuit by conveying the circuit beneath a free falling curtain of said liquid substance whose viscosity is selected from the range 500 to 1200 mPa's at impingement on said circuit, adjusting the height of said curtain above said circuit to produce a rate of flow at impingement selected from the range 60 to 100 m/min, and adjusting the rate at which said circuit is conveyed beneath said curtain to be greater than a rate slightly less than the rate at which said curtain falls on said circuit.

2. A process according to claim 1 wherein the viscosity is selected from the range 600 to 900 mPa's, and the rate of flow of the curtain is selected from the range 70 to 120 m/min.

3. A process according to claim 1, including heating the liquid substance so that it impinges on the printed circuit at a temperature at least 20° C. above the temperature of the printed circuit.

* * * * *

REEXAMINATION CERTIFICATE (2315th)
United States Patent [19]
Losert et al.

[11] B1 4,230,793
[45] Certificate Issued   Jun. 14, 1994

[54] PROCESS FOR THE PRODUCTION OF SOLDER MASKS FOR PRINTED CIRCUITS

[75] Inventors: Ewald Losert, Rheinfelden; Heinz Rembold, Arlesheim, both of Switzerland

[73] Assignee: Ciba-Geigy Corporation, Ardsley, N.Y.

Reexamination Request:
No. 90/002,433, Sep. 9, 1991

Reexamination Certificate for:
Patent No.: 4,230,793
Issued: Nov. 15, 1978
Appl. No.: 960,971
Filed: Oct. 28, 1980

[30] Foreign Application Priority Data

Nov. 21, 1977 [CH] Switzerland .................. 14182/77

[51] Int. Cl.$^5$ ................................................ G03C 5/00
[52] U.S. Cl. .................................. 430/315; 430/935; 427/96; 427/420; 228/215
[58] Field of Search ............... 430/315, 935; 427/96, 427/420

[56] References Cited
FOREIGN PATENT DOCUMENTS
2322051  11/1973  Fed. Rep. of Germany .

OTHER PUBLICATIONS

The Encyclopedia of Polymer Science and Technology, 1965, vol. 3, pp. 766, 778–782.
Brown, The Journal of Fluid Mechanics, 10 (1961) pp. 297–305.
Modern Plastics, Sep. 1962, pp. 134–231.
The Lumberman 29th Annual Review, Dec. 29, 1959.

*Primary Examiner*—Christopher D. RoDee

[57] ABSTRACT

A process for producing solder masks on double sided printed circuit boards, comprising conveying the boards beneath a free falling curtain of a photopolymer to form a thin layer on a surface of the board, irradiating with ultra violet light areas of the surface other than those that need to be soldered and then, by subsequent development, dissolving the unirradiated areas of the layer. The viscosity of the photopolymer is between 500 to 1200 mPa's at impingement on the surface of the circuit and the height of the curtain is selected so that the rate of flow of the polymer onto the circuit is between 60 to 160 m/min. Also the rate at which the circuits are conveyed beneath the curtain is greater than a rate slightly less than the rate at which the polymer flows onto the circuit.

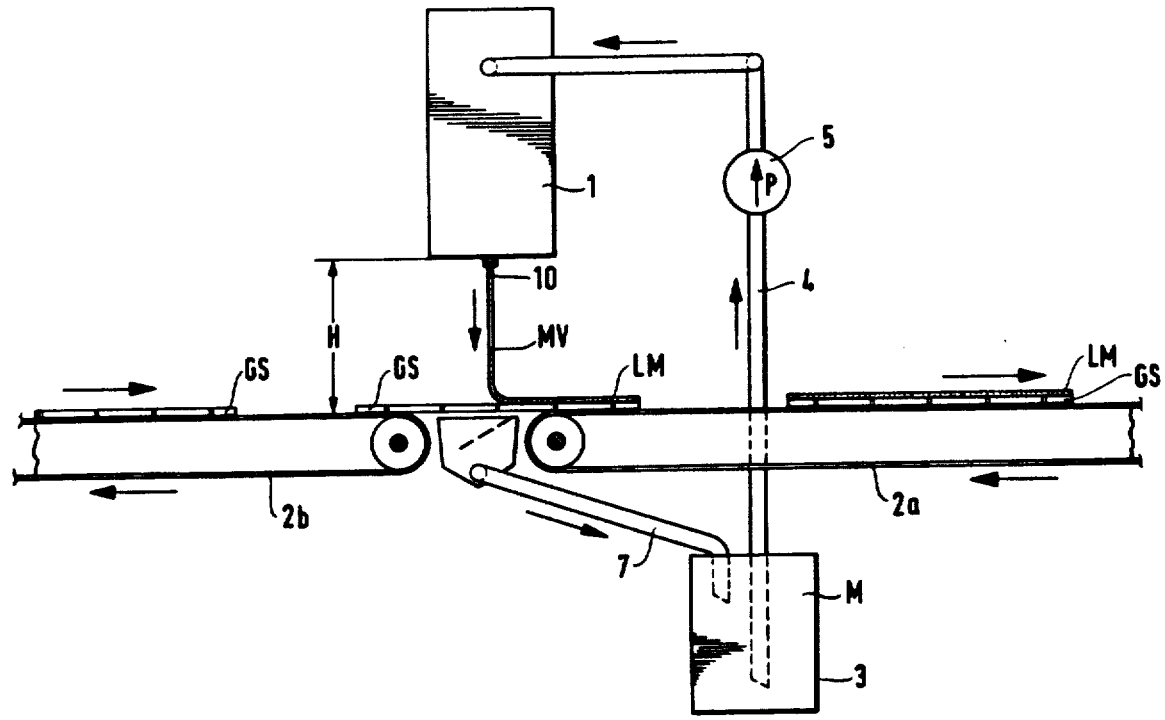

REEXAMINATION CERTIFICATE ISSUED UNDER 35 U.S.C. 307

NO AMENDMENTS HAVE BEEN MADE TO THE PATENT.

AS A RESULT OF REEXAMINATION, IT HAS BEEN DETERMINED THAT:

The patentability of claims 1 through 3 is confirmed.

* * * * *